3,246,994
Patented Apr. 19, 1966

United States Patent Office 3,246,994

PLATING SEMICONDUCTOR MATERIALS

Ian M. Ritchie, Wakefield, Mass., assignor to Transitron Electronic Corporation, Wakefield, Mass., a corporation of Delaware No Drawing. Filed Jan. 17, 1962, Ser. No. 166,939
4 Claims. (Cl. 106—1)

The present invention relates in general to methods and means for plating semiconductors and more particularly concerns a novel electroless copper plating solution for establishing an ohmic contact upon a semiconductor body.

It is an important object of the present invention to provide an electroless copper plating solution for depositing an ohmic contact on a semiconductor body, especially silicon, or other material having suitable oxidation states, chemical states and the like.

According to the invention copper fluoroborate, boric acid, fluoroboric acid and hydrofluoric acid are combined to form a solution which plates copper on a silicon bar deposited in the solution at room temperature.

A preferred embodiment of the invention incorporates 75 cc. of copper fluoroborate solution at a 45% concentration, 2 gms. of boric acid, 5 cc. of fluoroboric acid at 49% concentration and 20 cc. of hydrofluoric acid at 48% concentration. A bar of silicon may then be deposited in this solution at room temperature and copper will plate out on the silicon block to establish good conductive contact with the silicon body.

The specific concentrations and amounts set forth above are believed to be optimum. The following deviations from the specifications set forth above are believed to result in a solution which will plate according to the invention, though with less efficiency. The copper fluoroborate solution may be of a concentration of from 30 to 60% and be in an amount from 50 to 100 cc. The weight of boric acid may be within ⅔ gm. of the specified 2 gms. The fluoroboric acid may be at a concentration of 26% to 82% and deviate from the specified 5 cubic centimeters by nearly 2 cubic centimeters. The hydrofluoric acid may be in a concentration of from 28% to 68% and from 16 to 24 cc. in the solution.

It is expected that the solution plates at least within a range from 20° C. to 40° C.

There has been described novel methods and means for electroless copper plating material. It is evident that those skilled in the art may now make numerous modifications of and departures from the specific solution and techniques described herein without departing from the inventive concepts. Consequently, the invention is to be construed as limited only by the spirit and scope of the appended claims.

What is claimed is:

1. An electroless copper plating solution consisting essentially of copper fluoroborate, boric acid, fluoroboric acid and hydrofluoric acid, wherein the concentration of said copper fluoroborate is within the range of 30% to 60%,
   - the concentration of said fluoroboric acid is within the range of 26% to 82%,
   - the concentration of said hydrofluoric acid is within the range of 28% to 68%,
   - the relative volumes of said copper fluoroborate solution, said fluoroboric acid and said hydrofluoric acid in cc. is within the ranges of 50 to 100; 3 to 7; 16 to 24, respectively, and the weight of said boric acid for said stated concentration ranges is within the range of 1⅓ to 2⅔ gms.

2. A solution in accordance with claim 1 wherein the concentration and relative volume of said compounds is substantially at the center of the stated ranges.

3. A method of plating a silicon material with copper which method includes the steps of immersing said material in the solution defined by claim 1 and allowing said immersed body to remain in said solution until copper of a desired thickness is plated upon said silicon material.

4. A method in accordance with claim 3 wherein said solution is at a temperature substantially within a range of from 20° C. to 40° C.

References Cited by the Examiner

UNITED STATES PATENTS

| | | | |
|---|---|---|---|
| 2,523,160 | 9/1950 | Struyk | 204—52 |
| 2,814,589 | 11/1957 | Waltz | 117—130 |
| 2,933,422 | 4/1960 | Mason | 106—1 XR |
| 2,990,296 | 6/1961 | Hoke | 106—1 XR |

OTHER REFERENCES

Wm. Schechter, B. Jackson and Roy Adams: "Boron Hydrides and Related Compounds," Callery Chemical Company, May 1954, pages 125 and 126.

ALEXANDER H. BRODMERKEL, *Primary Examiner.*

JOSEPH REBOLD, MORRIS LIEBMAN, *Examiners.*